United States Patent
Kwon et al.

(10) Patent No.: US 10,733,937 B2
(45) Date of Patent: Aug. 4, 2020

(54) ORGANIC LIGHT-EMITTING DIODE DISPLAY AND OPERATION METHOD THEREOF

(71) Applicant: LG Display Co., Ltd., Seoul (KR)

(72) Inventors: Yong-Chul Kwon, Seoul (KR); Dong-Won Park, Goyang-si (KR); Dong-Woo Lee, Buyeo-gun (KR); Joon-Hee Lee, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 18 days.

(21) Appl. No.: 16/139,729

(22) Filed: Sep. 24, 2018

(65) Prior Publication Data

US 2019/0096329 A1    Mar. 28, 2019

(30) Foreign Application Priority Data

Sep. 25, 2017    (KR) ........................ 10-2017-0123374

(51) Int. Cl.
   *G09G 3/3258* (2016.01)
   *G09G 3/3225* (2016.01)
   *H01L 27/32* (2006.01)

(52) U.S. Cl.
   CPC ......... *G09G 3/3258* (2013.01); *G09G 3/3225* (2013.01); *H01L 27/3297* (2013.01); *G09G 2300/0842* (2013.01); *G09G 2300/0866* (2013.01); *G09G 2310/08* (2013.01); *G09G 2320/0295* (2013.01); *G09G 2320/043* (2013.01); *G09G 2320/048* (2013.01); *G09G 2360/16* (2013.01)

(58) Field of Classification Search
   CPC .. G09G 3/3208; G09G 3/3225; G09G 3/3258; G09G 2300/0842; G09G 2300/0866; G09G 2310/08; G09G 2320/029; G09G 2320/0295; G09G 2320/043; G09G 2320/048; G09G 2330/12; G09G 2360/16; H01L 27/3225; H01L 27/3297
   See application file for complete search history.

(56) References Cited

U.S. PATENT DOCUMENTS

| | | | | |
|---|---|---|---|---|
| 2013/0162622 | A1* | 6/2013 | Ebisuno | G09G 3/3208 |
| | | | | 345/212 |
| 2014/0176524 | A1* | 6/2014 | Lee | G09G 3/3233 |
| | | | | 345/212 |
| 2017/0294166 | A1* | 10/2017 | Kim | G09G 3/3266 |

* cited by examiner

Primary Examiner — Nelson M Rosario
(74) Attorney, Agent, or Firm — Birch, Stewart, Kolasch & Birch, LLP

(57) ABSTRACT

An organic light-emitting diode (OLED) display can include a display panel including sub-pixels; a deterioration sensing unit configured to sense a deterioration state of the display panel; a power supply configured to output a high voltage for driving the sub-pixels; and a timing controller configured to: receive a deterioration sensing result including information on the deterioration state of the display panel from the deterioration sensing unit, continuously vary the high voltage based on the deterioration sensing result received from the deterioration sensing unit, and provide the varied high voltage to the sub-pixels.

18 Claims, 12 Drawing Sheets

ORGANIC LIGHT-EMITTING DIODE DISPLAY AND OPERATION METHOD THEREOF

CROSS-REFERENCE TO RELATED APPLICATIONS

This application claims the priority benefit of Korean Patent Application No. 10-2017-0123374, filed in the Republic of Korea on Sep. 25, 2017, the entirety of which is hereby incorporated by reference as if fully set forth herein.

BACKGROUND OF THE INVENTION

Field of the Invention

The present invention relates to an organic light-emitting diode (OLED) display and an operation method thereof and, more specifically, to an OLED display and an operation method thereof, in which a high voltage applied to sub-pixels is continuously varied according to a display panel deterioration state.

Discussion of the Related Art

With the development of an information technology, the market for display devices serving as connection media between users and information is expanding. Accordingly, an organic light-emitting diode (OLED) display is increasingly used.

The OLED display includes a display panel including a plurality of sub-pixels, a driver outputting driving signals for driving the display panel, and a power supply for generating power to be supplied to the display panel and the driver. The driver includes a scan driver which supplies a scan signal (or gate signal) to the display panel and a data driver which supplies a data signal to the display panel.

The OLED display can display an image when driving signals, for example, a scan signal and a data signal, are supplied to the sub-pixels of the display panel, and selected sub-pixels emit light.

The OLED display is used in various applications, such as TVs, navigation systems, video players, personal computers (PCs), wearable devices (watches, glasses, etc.) and mobile phones (smartphones).

FIG. 1 is a circuit diagram of a sub-pixel of a related art OLED display and FIG. 2 is a current/voltage curve (an I-V curve) of a driving transistor according to an operation method of the related art OLED display. As shown in FIGS. 1 and 2, in the related art OLED display, the sub-pixels operate according to a driving transistor DTFT, which is driven in a saturation region. Accordingly, the related art OLED display uses a high voltage EVDD to drive the driving transistor DTFT in the saturation region, causing unnecessary power consumption.

To solve this problem, a different OLED display has been proposed. FIG. 3 is a graph illustrating an operation method of another related art OLED display and FIG. 4 is a current/voltage curve (an I-V curve) of a driving transistor according to the operation method of the related art OLED display.

As shown, a high voltage is switched depending on the criterion thereof (e.g., average picture level (APL)) while being varied. That is, normal operation (1) and linear operation (2) are alternately performed. Normal operation (1) in which the high voltage is fixed such that the driving transistor operates in the saturation region requires high power consumption. On the other hand, linear operation can reduce power consumption by varying the high voltage to increase a data voltage Vdata instead of decreasing the high voltage.

As described above, an OLED display operating in the normal operation method (1) requires high power consumption because it uses a high voltage. In the linear operation method (2), which increases the data voltage to drive the driving transistor, a data voltage gradually increases compared to the initial state that is used due to deterioration of the driving transistor and the display panel. Due to the characteristics of linear operation using a high data voltage, a data voltage increase margin is insufficient when a data voltage increase for deterioration compensation is considered, reducing the lifespan of the OLED display. That is, since a voltage in response to deterioration of the data driver is used as the OLED display deteriorates, a margin of voltages that can be used is insufficient.

Therefore, a method for increasing the service life of the OLED display while reducing power consumption thereof is needed.

SUMMARY OF THE INVENTION

An object of the present invention is to provide an OLED display and an operation method thereof for driving a display panel in consideration of both power consumption and the life of the display panel.

Another object of the present invention is to provide an OLED display and an operation method thereof for reducing power consumption by continuously varying an optimal high voltage for driving a display panel.

Yet another object of the present invention is to provide an OLED display and an operation method thereof for increasing the service life of the OLED display by continuously varying an optimal high voltage for driving a display panel.

An organic light-emitting diode (OLED) display according to an embodiment of the present invention to achieve the objects includes: a display panel including sub-pixels; a deterioration sensing unit for sensing a deterioration state of the display panel; a power supply providing a voltage for driving the sub-pixels; and a timing controller for receiving a sensing result of the deterioration sensing unit and controlling a high voltage supplied to the sub-pixels through the power supply to be continuously varied based on the deterioration sensing result.

In the OLED display according to an embodiment of the present invention, the timing controller can continuously vary a lower boundary of variable values of a high voltage.

In the OLED display according to embodiments of the present invention, the timing controller can continuously vary the lower boundary of variable values of the high voltage based on a deterioration measurement value of a pixel suffering the most severe deterioration.

In the OLED display according to an embodiment of the present invention, the timing controller can gradually increase the lower boundary of variable values of the high voltage.

In the OLED display according to an embodiment of the present invention, the high voltage can be varied between a saturation region and the lower boundary.

In the OLED display according to embodiments of the present invention, the deterioration sensing unit can sense the deterioration state with reference to at least one of a plurality of deterioration factors including a threshold voltage (Vth) variation, a driving time accumulation value, an average picture level (APL) and color information input data.

An operation method of an OLED display according to an embodiment of the present invention includes: sensing a deterioration state of a display panel; and continuously varying a high voltage supplied to sub-pixels through a power supply based on a deterioration sensing result to drive driving transistors of the sub-pixels.

The operation method of an OLED display, according to embodiments of the present invention, provides a high voltage varying between a gradually increasing lower boundary of variable values of the high voltage and a saturation region based on a deterioration measurement value of a pixel suffering the most severe deterioration to drive driving transistors of a display panel.

The OLED display and the operation method thereof, according to an embodiment of the present invention, can have the following advantages.

First, it is possible to reduce power consumption by driving the display panel in consideration of both the power consumption and the life of the display panel.

Second, it is possible to increase the service life of the display panel by driving the display panel in consideration of both power consumption and the life of the display panel.

DETAILED DESCRIPTION OF THE EMBODIMENTS

Figure 1:
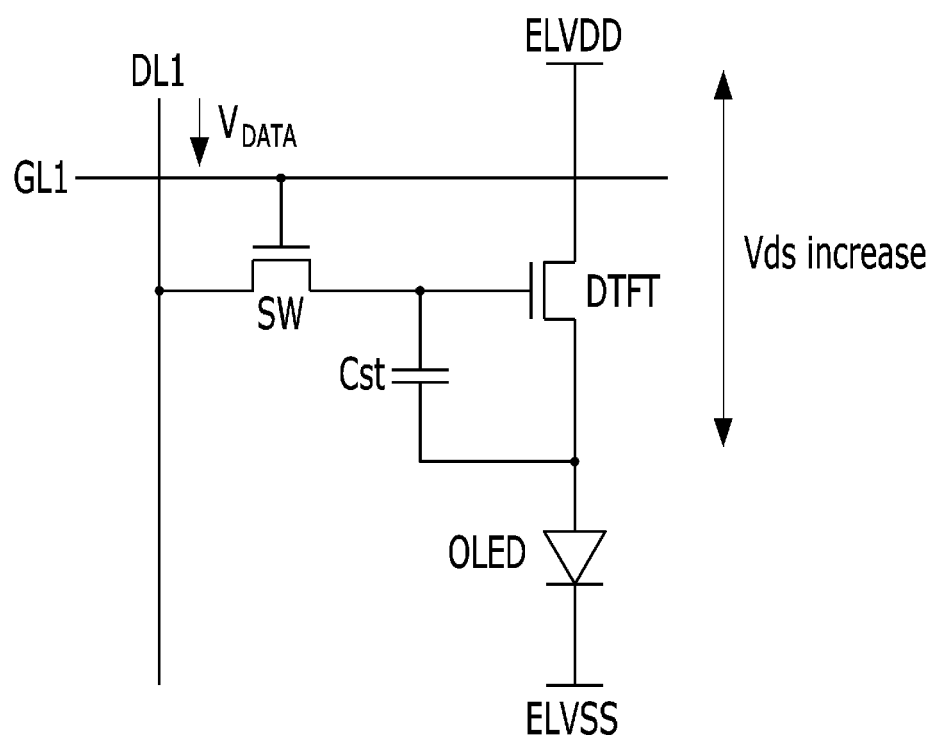
FIG. 1 is a circuit diagram of a sub-pixel of a related art OLED display.
Figure 2:
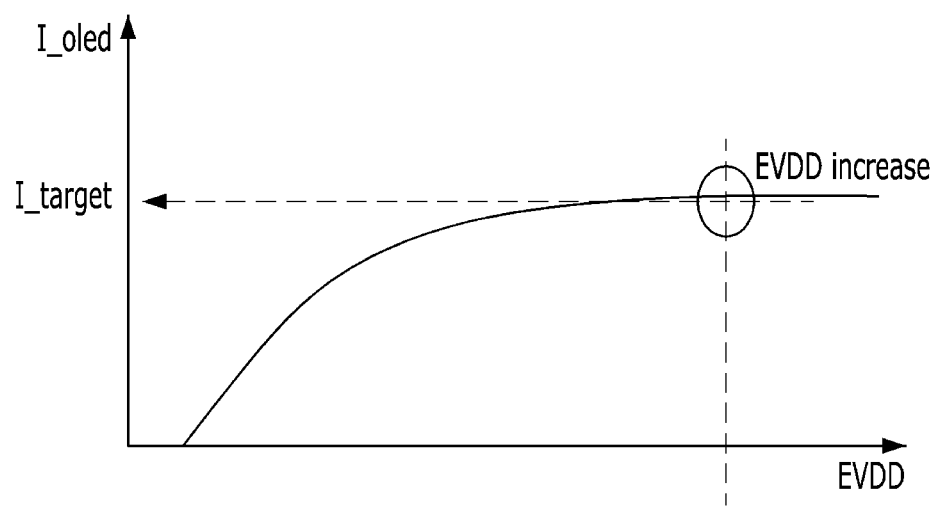
FIG. 2 shows a current/voltage curve of a driving transistor according to an operation method of the related art OLED display.
Figure 3:
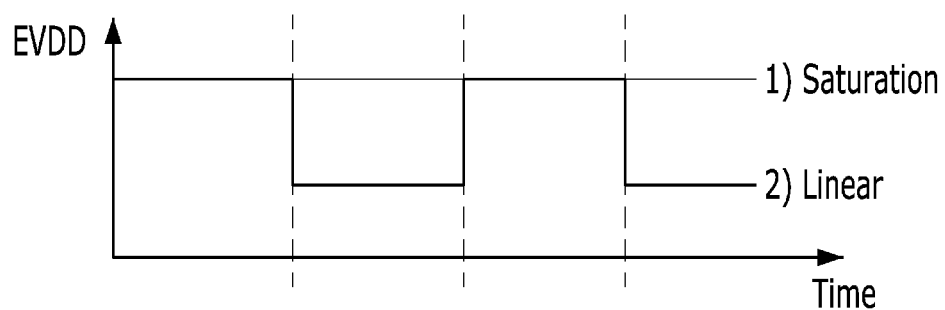
FIG. 3 is a graph showing an operation method of another related art OLED display.
Figure 4:
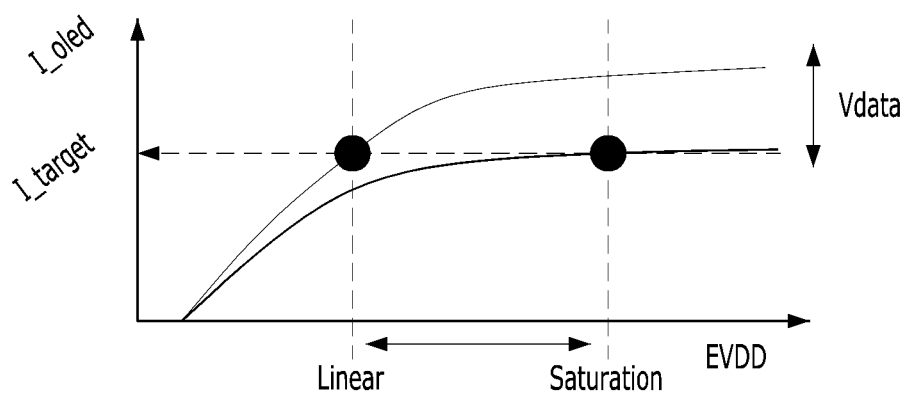
FIG. 4 shows a current/voltage curve of a driving transistor in the other related art OLED display.

Specific structural and functional descriptions with respect to embodiments of the present invention disclosed below are for the purpose of explaining the embodiments of the present invention, and the present invention can be embodied in various forms and is not limited to the embodiments described below.

The present invention can be modified in various ways and embodied in many alternate forms. Accordingly, while the embodiments are susceptible to various modifications and alternative forms, specific embodiments thereof are shown by way of example in the drawings and will herein be described in detail. It should be understood, however, that there is no intent to limit the embodiments to the particular forms disclosed, but on the contrary, the embodiments are to cover all modifications, equivalents, and alternatives falling within the spirit and scope of the disclosure.

Although terms such as, for example, "first" and "second" may be used to describe various elements, the components should not be limited by these terms. These terms are merely used to distinguish the same or similar elements from each other. For example, a first component may be called a second component and, similarly, the second component may be called the first component without departing from the scope of the present invention.

When an element is "coupled" or "connected" to another element, it should be understood that a third element may be present between the two elements although the element may be directly coupled or connected to the other element. When an element is "directly coupled" or "directly connected" to another element, it should be understood that no element is present between the two elements. Other representations describing relationships between components, that is, "between," "directly between" or "adjacent to" and "directly adjacent to" should be understood in the same manner.

The terms used in the specification are for the purpose of describing specific embodiments and are not intended to limit the present invention. The singular forms are intended to include the plural forms as well unless the context clearly indicates otherwise. It will be further understood that the terms "comprises" or "includes" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which example embodiments pertain. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

In addition, when a certain embodiment can be realized in a different manner, a function or an operation specified in a specific block may be executed in an order different from that specified in a flowchart. For example, two consecutive blocks may be simultaneously executed or may be executed in reverse depending on the related function or operation.

Hereinafter, embodiments of the present invention will be described with reference to the attached drawings.

OLED displays can be realized as a top-emission type, a bottom-emission type or a dual emission type depending on a light emission direction.

OLED displays can be realized in an inverted staggered structure including a back channel etched (BCE) structure or an etch stopper (ES), a staggered structure or a coplanar structure depending on a transistor channel structure.

OLED displays can be realized based on oxide, low-temperature polysilicon (LTPS), amorphous silicon (a-Si) or polysilicon (p-Si) depending on the semiconductor material of a transistor.

OLED displays can be configured for use in TVs, navigation systems, video players, personal computers (PCs), wearable devices (watches, glasses, etc.), mobile phones (smartphones), and the like.

Figure 5:
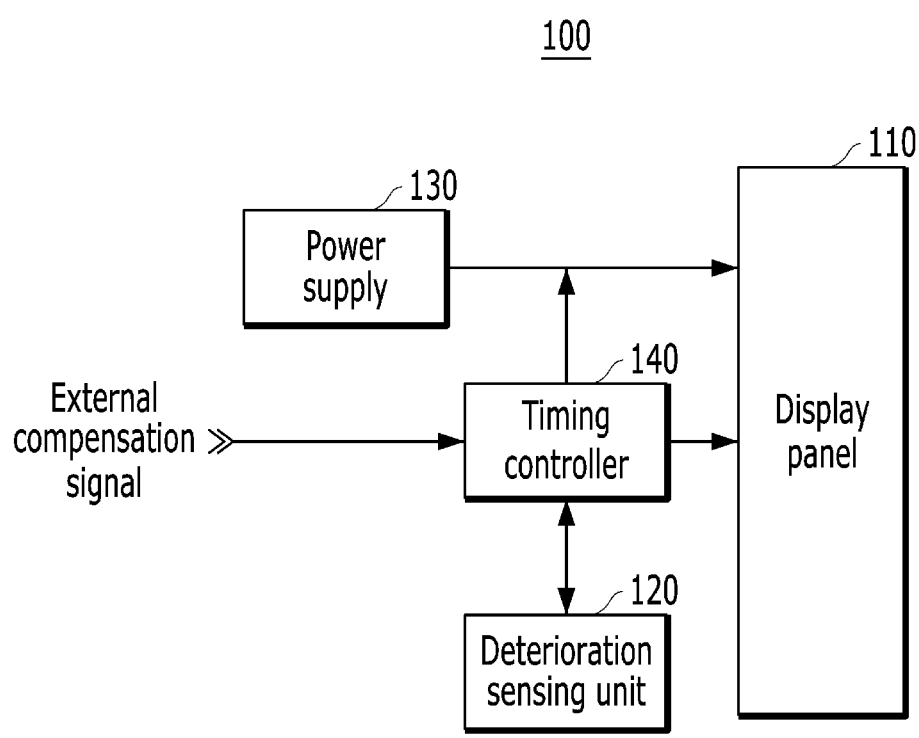
FIG. 5 is a block diagram illustrating a schematic configuration of an OLED display according to an embodiment of the present invention.

FIG. 5 is a block diagram illustrating a schematic configuration of an OLED display 100 according to an embodiment of the present invention.

Referring to FIG. 5, the OLED display includes a display panel 110 having sub-pixels, a deterioration sensing unit 120 for sensing a deterioration state of the display panel 110, a power supply 130 which provides a voltage for driving the sub-pixels, and a timing controller 140 which receives a sensing result of the deterioration sensing unit and controls a high voltage supplied to the sub-pixels through the power supply to be continuously varied and provided to the sub-pixels based on the sensing result. The timing controller 140 can include a memory storing information on driving of the OLED display 100 and compensation data for compensation.

The deterioration sensing unit 120 senses a degree of deterioration using various types of information to sense a deterioration state of the display panel 110. A deterioration factor used for the deterioration sensing unit 120 to sense a degree of deterioration of the display panel 110 can include one or more of threshold voltage (Vth) variation, a driving time accumulation value, an average picture level (APL) and color information input data.

Figure 6:
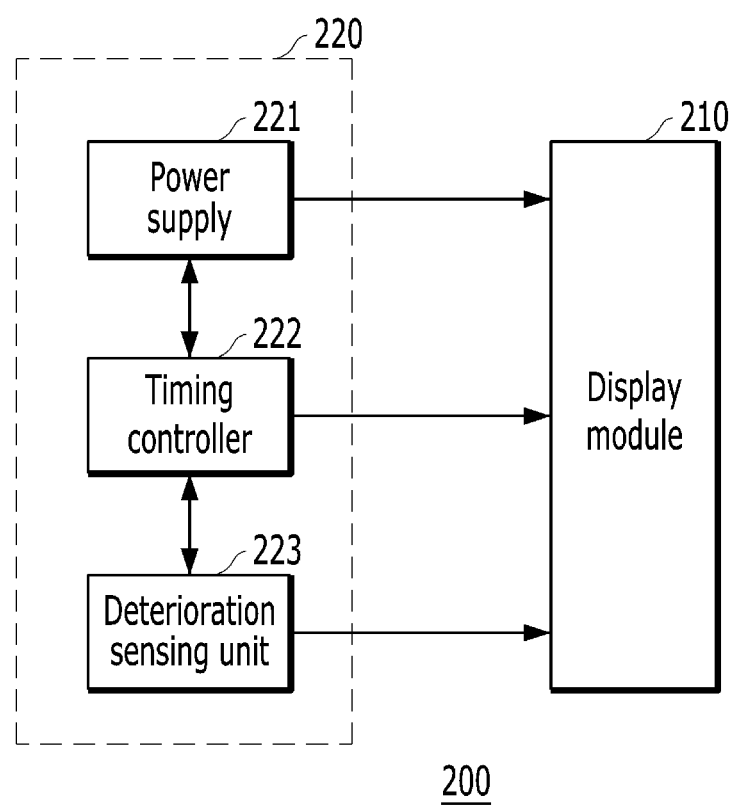
FIG. 6 is a block diagram illustrating a schematic configuration of an OLED display according to another embodiment of the present invention.

FIG. 6 is a block diagram illustrating a schematic configuration of an OLED display 200 according to another embodiment of the present invention. Distinguished from the embodiment illustrated in FIG. 5, the OLED display 200 has a configuration in which a display module 210 and a set 220 are separated from each other by a predetermined distance. Here, a power supply 221, a timing controller 222 and a deterioration sensing unit 223 are not included in the set 220. The timing controller 222 can include a memory storing information on driving of the OLED display 200 and compensation data for compensation.

Figure 7:
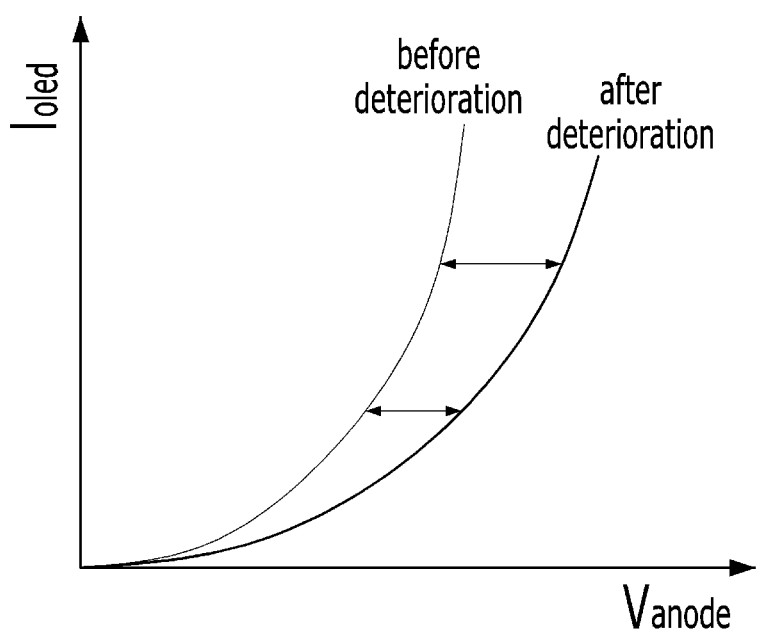
FIG. 7 is a graph showing a deterioration trend of an OLED element.

FIG. 7 is a graph showing a deterioration trend of an OLED element. The graph shows a deterioration trend of an OLED included in sub-pixels of the display panel. It can be known from the graph that variation in the anode voltage Vanode of the OLED, that is, the voltage of the source node of the driving transistor, increases according to the current Ioled of the OLED before/after deterioration.

Figure 8A:
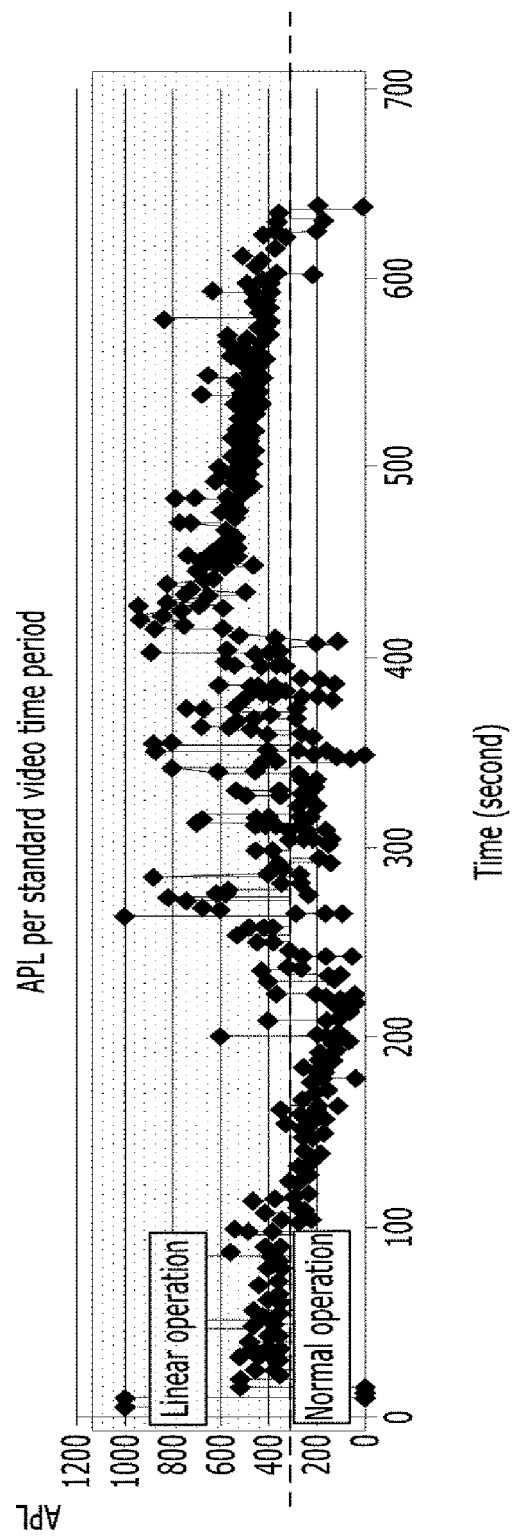
FIGS. 8A and 8B are graphs showing average picture levels (APL) before and after deterioration of a display panel.
Figure 8B:
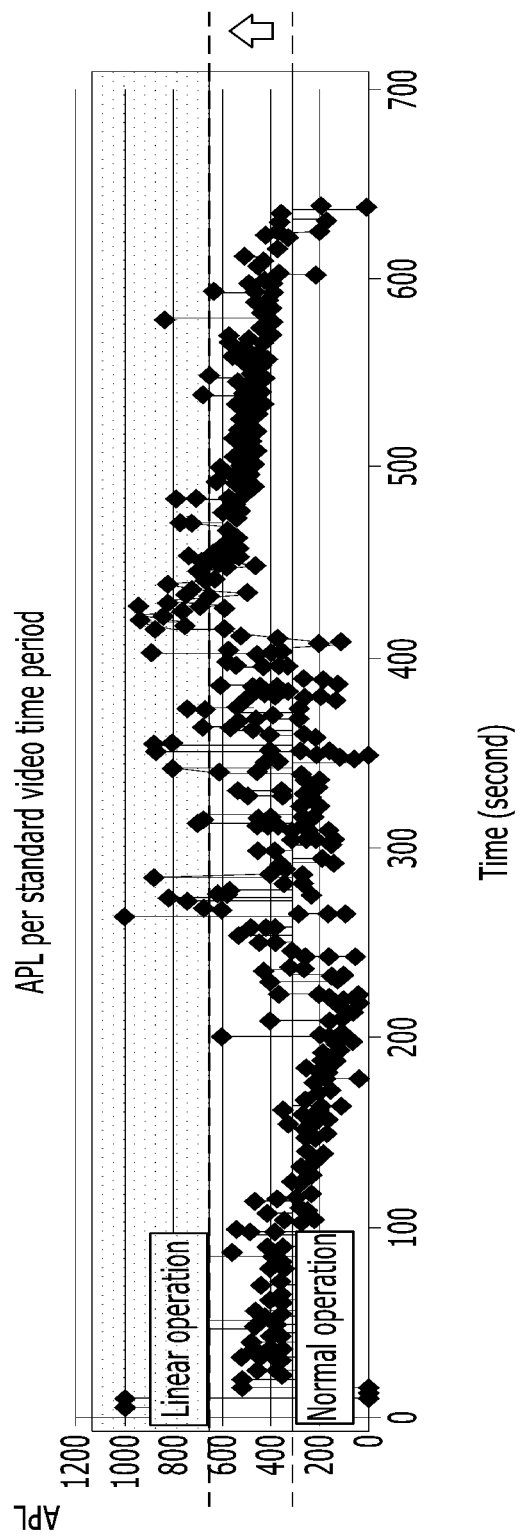

FIGS. 8A and 8B are graphs showing average picture levels (APL) before and after deterioration of the display panel. The APL represents an average of ratios of luminance of the current frame of an image to maximum luminances of respective frames, and is closer to 100% for a brighter image and closer to 0% for a darker image. Here, the APL can be calculated for one frame or multiple frames. That is, APL can be calculated per frame or per frame block composed of multiple frames. The APL can be calculated such that image characteristics of an input frame are reflected. For example, the APL can be calculated such that it is correlated to the number of red, green and blue pixels which emit light in order to express an image included in an input frame. Furthermore, the APL can be calculated by assigning a predefined weight to the number of each of red, green and blue pixels emitting light.

A peak luminance of an image decreases when APL increases and increases when APL decreases. In conventional OLED displays, however, a driving voltage supplied to OLEDs through a driving voltage line is fixed to a DC voltage level, and thus unnecessary power consumption occurs for an image having low peak luminance.

The proportion of linear operation is high, compared to normal operation, in the initial state, as shown in FIG. 8A. The proportion of linear operation gradually decreases in a deteriorated state, as shown in FIG. 8B. That is, the APL gradually increases as deterioration progresses.

Figure 9:
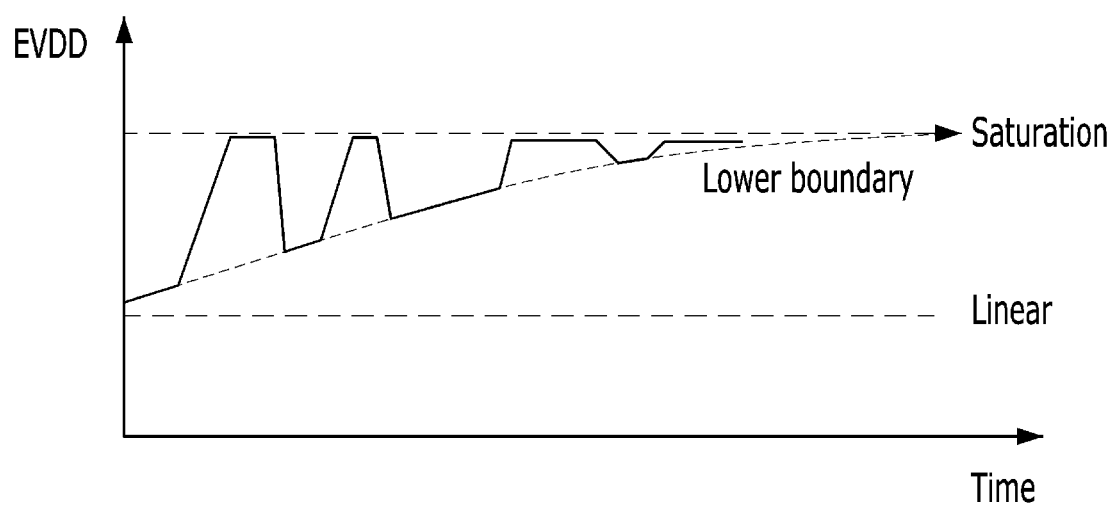
FIG. 9 is a graph showing variation in a high voltage applied to driving transistors of the display panel of the OLED display according to an embodiment of the present invention.

FIG. 9 is a graph showing variation in a high voltage applied to driving transistors of the display panel of the OLED display according to an embodiment of the present invention. The timing controller continuously varies a lower boundary of variable values of the high voltage. Here, the timing controller continuously varies the lower boundary of variable values of the high voltage based on a deterioration measurement value of a pixel or a sub-pixel suffering the severest deterioration. The timing controller gradually increases the lower boundary of variable values of the high voltage. Here, the high voltage varies between a saturation region and the lower boundary.

Figure 10:
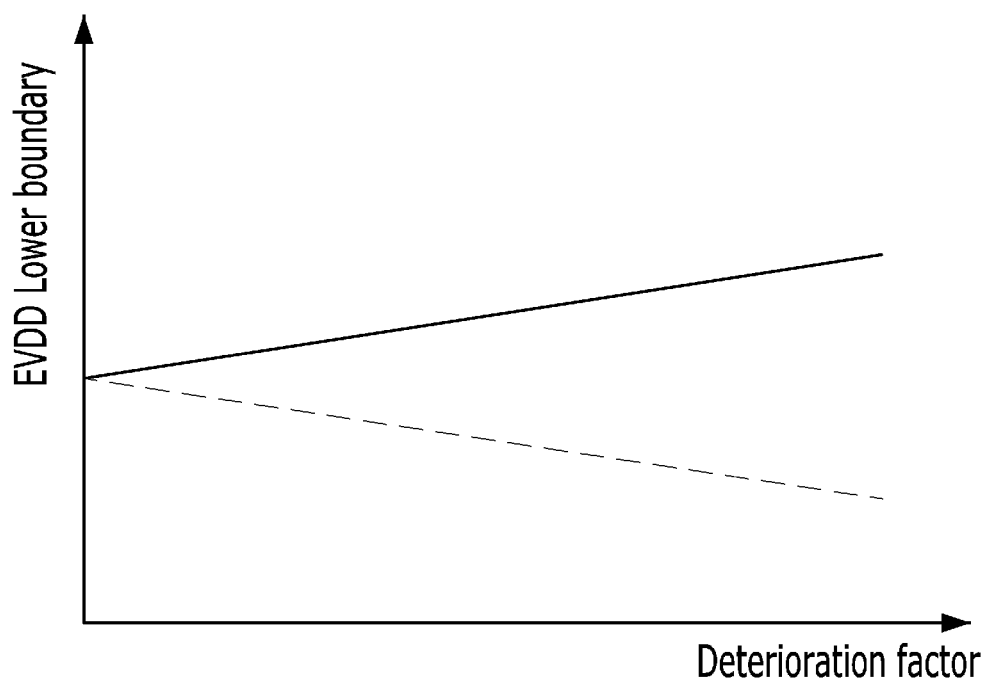
FIG. 10 is a graph showing variation in a lower boundary of variable values of the high voltage in accordance with a deterioration factor according to an embodiment of the present invention.

FIG. 10 is a graph showing variation in the lower boundary of variable values of the high voltage in accordance with a deterioration factor. As shown, the lower boundary of variable values of the high voltage gradually increases in accordance with the deterioration factor. For example, the lower boundary of variable values of the high voltage can be gradually increased as the deterioration factor increases. However, the lower boundary can be controlled to decrease as necessary.

Figure 11:
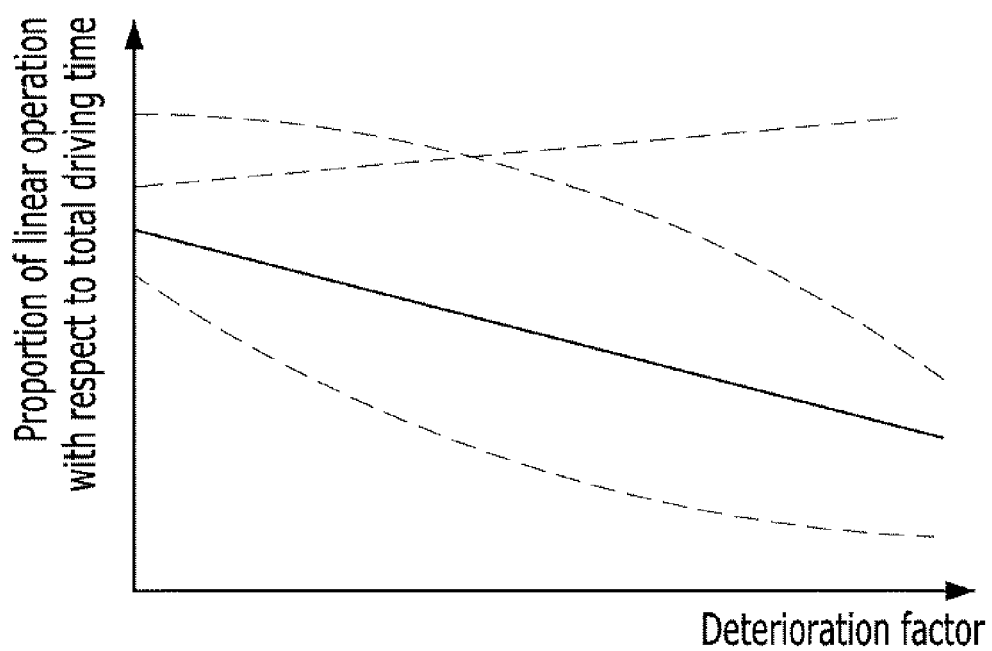
FIG. 11 is a graph showing the proportion of linear operation with respect to total driving time according to a deterioration factor according to an embodiment of the present invention.

FIG. 11 is a graph showing the proportion of linear operation with respect to total driving time according to a deterioration factor. The proportion of linear operation with respect to the total driving time gradually decreases in accordance with the deterioration factor. However, the lower boundary can be controlled to increase as necessary.

Figure 12:
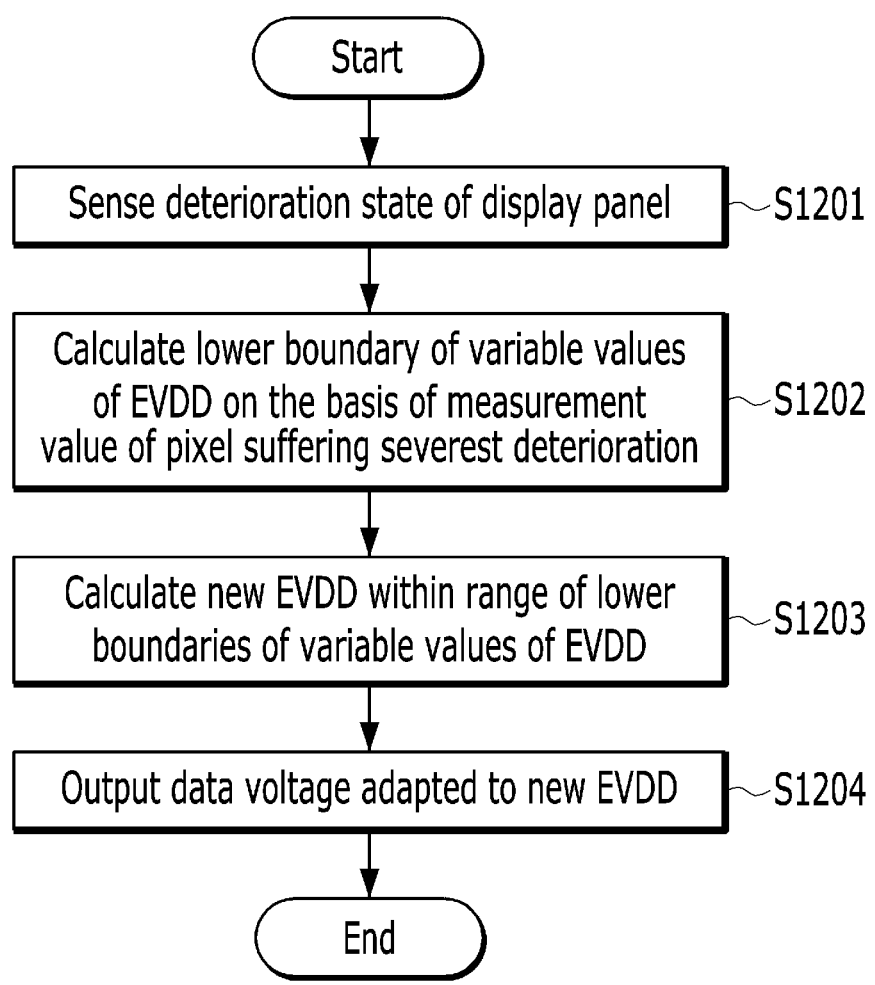
FIG. 12 is a flowchart illustrating a process of an operation method of the OLED display according to an embodiment of the present invention.

FIG. 12 is a flowchart illustrating a process of an operation method of the OLED display according to an embodiment of the present invention. A deterioration state of the display panel is sensed through the deterioration sensing unit. The deterioration state is sensed according to various deterioration factors. A position having the largest delta value A measured per data driver channel and a degree of deterioration are transmitted to an analog-to-digital converter (ADC) of a data driver and the memory of the timing controller. The delta value A can include a threshold voltage of the driving transistors of the sub-pixels, an accumulation value of image data, driving time, and the like (S1201).

Lower boundaries of variable values of a high voltage EVDD are calculated based on a measurement value of a pixel or a sub-pixel suffering the severest deterioration (S1202).

New high voltages EVDD are continuously calculated (e.g., dynamically updated) within the range of the lower boundaries of the variable values of the high voltage EVDD. Here, the high voltage is varied to below a specific ratio or a specific value with respect to a previous value (S1203).

A data voltage Vdata adapted to a new high voltage EVDD is calculated and supplied to the sub-pixels to drive the driving transistors of the sub-pixels (S1204). For example, a data voltage Vdata can be dynamically updated based on a new high voltage EVDD.

As described above, the OLED displays according to an embodiment of the present invention gradually increase the lower boundaries of variable values of the high voltage in accordance with lapse of time (e.g., as time goes on) or a degree of deterioration. Here, the high voltage is varied between the saturation region and a lower boundary of variable values of the high voltage. Accordingly, power consumption of the OLED displays according to an embodiment of the present invention can be reduced and the lifespan thereof can be increased.

Although embodiments of the present invention have been described above, those skilled in the art will appreciate that various modifications and variations can be made in the present invention without departing from the spirit or scope of the present invention disclosed in the appended claims.

What is claimed is:

1. An organic light-emitting diode (OLED) display comprising:
   a display panel including sub-pixels;
   a deterioration sensing unit configured to sense a deterioration state of the display panel;
   a power supply configured to output a high voltage for driving the sub-pixels; and
   a timing controller configured to:
      receive a deterioration sensing result including information on the deterioration state of the display panel from the deterioration sensing unit,
      continuously vary a lower boundary of variable values of the high voltage based on the deterioration sensing result received from the deterioration sensing unit, and
      provide the varied high voltage to the sub-pixels.

2. The OLED display according to claim 1, wherein the deterioration sensing unit is further configured to:
   sense the deterioration state based on at least one of a plurality of deterioration factors including a threshold voltage (Vth) variation, a driving time accumulation value, an average picture level (APL) or color information input data.

3. The OLED display according to claim 1, wherein a position having a largest delta value measured per data driver channel and a degree of deterioration are transmitted to an analog-to-digital converter (ADC) of a data driver and a memory of the timing controller, and
   wherein the high voltage is varied based on the largest delta value measured per data driver channel and the degree of deterioration.

4. The OLED display according to claim 3, wherein the delta value is based on a threshold voltage of driving transistors of the sub-pixels, an accumulation value of image data, or a driving time.

5. The OLED display according to claim 1, wherein the timing controller is configured to:
   continuously vary the lower boundary of variable values of the high voltage based on a deterioration measurement value of a pixel, including some of the sub-pixels, which is suffering a most severe deterioration in the display panel or a deterioration measurement value of a sub-pixel suffering a most severe deterioration among the sub-pixels.

6. The OLED display according to claim 1, wherein the timing controller is configured to:
   gradually increase the lower boundary of variable values of the high voltage.

7. The OLED display according to claim 1, wherein the high voltage is varied between a saturation region and the lower boundary.

8. The OLED display according to claim 7, wherein the high voltage is varied to below a specific ratio or a specific value with respect to a previous value.

9. A method of operating an organic light-emitting diode (OLED) display including a display panel including sub-pixels, the method comprising:
   sensing, via a deterioration sensing unit, a deterioration state of the display panel;
   outputting, via a power supply, a high voltage for driving the sub-pixels;
   receiving, via a timing controller, a deterioration sensing result including information on the deterioration state of the display panel from the deterioration sensing unit;
   continuously varying, via the timing controller, a lower boundary of variable values of the high voltage based on the deterioration sensing result received from the deterioration sensing unit; and
   providing, via the timing controller, the varied high voltage to the sub-pixels.

10. The method according to claim 9, wherein the timing controller continuously varies the lower boundary of variable values of the high voltage based on a deterioration measurement value of a pixel, including some of the sub-pixels, which is suffering a most severe deterioration in the display panel or a deterioration measurement value of a sub-pixel suffering a most severe deterioration among the sub-pixels.

11. The method according to claim 9, further comprising:
   sensing the deterioration state based on at least one of a plurality of deterioration factors including a threshold voltage (Vth) variation, a driving time accumulation value, an average picture level (APL) or color information input data.

12. The method according to claim 9, further comprising:
   transmitting a position data having a largest delta value measured per data driver channel and a degree of deterioration to an analog-to-digital converter (ADC) of a data driver and a memory of the timing controller; and
   varying the high voltage based on the largest delta value measured per data driver channel and the degree of deterioration.

13. The method according to claim 12, wherein the delta value is based on a threshold voltage of driving transistors of the sub-pixels, an accumulation value of image data, or a driving time.

14. The method according to claim 9, wherein the timing controller gradually increases the lower boundary of variable values of the high voltage.

15. The method according to claim 9, wherein the timing controller varies the high voltage between a saturation region and the lower boundary.

16. A method of operating an organic light-emitting diode (OLED) display, the method comprising:
   sensing a deterioration state of a display panel;
   calculating lower boundaries of variable values of a high voltage based on a deterioration measurement value of a pixel or a sub-pixel suffering a severest deterioration;
   continuously calculating a new high voltage within a range of the lower boundaries of variable values of the high voltage; and
   calculating a data voltage adapted to the new high voltage and supplying the data voltage to sub-pixels in the display panel to drive driving transistors of the sub-pixels.

17. The method according to claim 16, wherein the driving transistors are driven with a high voltage which is continuously varied between a gradually increased lower boundary of variable values of the high voltage and a saturation region.

18. The method according to claim 16, further comprising:
- continuously increasing a lower boundary of variable values of the high voltage to generate a continuously varying lower boundary; and
- supplying a continuously varied high voltage to the sub-pixels based on the high voltage and the continuously varying lower boundary.

* * * * *